(12) United States Patent
Hsieh et al.

(10) Patent No.: US 10,725,953 B2
(45) Date of Patent: Jul. 28, 2020

(54) POWER DELIVERY CONTROL MODULE

(71) Applicant: EEVER TECHNOLOGY, INC., Taipei (TW)

(72) Inventors: Yu-Chih Hsieh, Hsinchu (TW); Yuan-Bo Chang, Taipei (TW); Sian-Jia Chen, Taoyuan (TW)

(73) Assignee: eEver Technology, Inc., Taipei (TW)

( * ) Notice: Subject to any disclaimer, the term of this patent is extended or adjusted under 35 U.S.C. 154(b) by 244 days.

(21) Appl. No.: 15/698,495

(22) Filed: Sep. 7, 2017

(65) Prior Publication Data
US 2018/0067530 A1    Mar. 8, 2018

Related U.S. Application Data

(60) Provisional application No. 62/384,728, filed on Sep. 8, 2016.

(51) Int. Cl.
| | | |
|---|---|---|
| G06F 11/30 | (2006.01) |
| G06F 13/38 | (2006.01) |
| G06F 1/22 | (2006.01) |
| G06F 1/26 | (2006.01) |
| G06F 1/28 | (2006.01) |

(Continued)

(52) U.S. Cl.
CPC .............. G06F 13/385 (2013.01); G06F 1/22 (2013.01); G06F 1/266 (2013.01); G06F 1/28 (2013.01); G06F 13/4068 (2013.01); G06F 13/4282 (2013.01); *G06F 1/3203* (2013.01); *G06F 2213/0042* (2013.01); *H01R 13/6598* (2013.01); *H01R 24/40* (2013.01); *H01R 31/065* (2013.01); *H01R 2107/00* (2013.01); *H02J 7/00* (2013.01); *H02J 2207/10* (2020.01);

(Continued)

(58) Field of Classification Search
CPC ...................................................... G06F 1/266
See application file for complete search history.

(56) References Cited

U.S. PATENT DOCUMENTS

| | | | | |
|---|---|---|---|---|
| 2011/0121656 A1* | 5/2011 | Hicks | ...................... | H02J 1/108 307/80 |
| 2012/0033338 A1* | 2/2012 | Van Leeuwen | .......... | H02H 3/38 361/62 |

(Continued)

FOREIGN PATENT DOCUMENTS

CN        205657589 U        10/2016

OTHER PUBLICATIONS

Chinese Office Action issued in corresponding application No. 201710785902.4 dated Jan. 16, 2020.

*Primary Examiner* — Volvivk Derose
(74) *Attorney, Agent, or Firm* — Winston Hsu (57) ABSTRACT

A power delivery control module includes a first interface, a second interface and a controller. The first interface is configured to be coupled with a first external device. The second interface is configured to be coupled with a second external device. The second interface is a USB Type-C interface, and the first interface is not a USB Type-C interface. The controller is coupled with the first interface and the second interface. Wherein when the first interface is coupled with the first external device and the second interface is coupled with the second external device, the power delivery control module selectively transfers power from the first external device to the second external device or from the second external device to the first external device.

13 Claims, 6 Drawing Sheets

(51) Int. Cl.
  _G06F 13/40_    (2006.01)
  _G06F 13/42_    (2006.01)
  _H01R 31/06_   (2006.01)
  _H02J 7/00_    (2006.01)
  _G06F 1/3203_  (2019.01)
  _H01R 13/6598_ (2011.01)
  _H05K 5/02_    (2006.01)
  _H01R 24/40_   (2011.01)
  _H01R 107/00_  (2006.01)

(52) U.S. Cl.
  CPC ............ _H05K 5/0278_ (2013.01); _Y02D 10/14_ (2018.01); _Y02D 10/151_ (2018.01)

(56) References Cited

U.S. PATENT DOCUMENTS

2015/0364908 A1* 12/2015 Odaohhara ............ H02H 3/085
  361/93.8
2017/0293347 A1* 10/2017 Wood, III ........... G06F 13/4282

\* cited by examiner

POWER DELIVERY CONTROL MODULE

CROSS-REFERENCE TO RELATED APPLICATIONS

This non-provisional application claims priority under 35 U.S.C. § 119(e) on Provisional Application No. 62/384,728 filed in U.S. on Sep. 8, 2016, the entire contents of which are hereby incorporated by reference.

TECHNICAL FIELD

The disclosure relates to a power delivery control module, more particularly to a power delivery control module having different interfaces.

BACKGROUND

Recently, with the developments of high-tech industry, manufacturers continuously release different types of high-tech products in the market, such as laptops, tablets or smart phones, etc. In general, those high-tech products operate using power supplied by power adapters. However, although power adapters provided by most manufacturers are similar, those power adapters are incompatible with each other. For example, a power adapter manufactured by a manufacturer is not adapted to products (e.g. laptops or smart phones) manufactured by another manufacturer.

In other words, products manufactured by a manufacturer are only allowed to be charged using power adapters produced by the manufacturer. In this case, not only inconveniences are caused to customers, but also more power adapters are necessarily manufactured as manufacturers continuously release new products. In order to solve the problems of wasting resources caused by different power adapters, a new type of power supply device and interface (Universal Serial Bus Type-C, hereafter "USB Type-C/USB Power Delivery") is provided for uniformity of power supply ports provided by different manufacturers and equipped with functions of power adapters, so that the wastes of resources and harmful effects on the environment could be reduced. However, during the transition period of promotions of USB Type-C/USB Power Delivery, new power adapters are still continuously produced and consequently the harmful effects on the environment are continuously created.

SUMMARY

The present disclosure provides a power delivery control module, which can allow information of supplied power and received power to be exchanged between a power adapter and a device incompatible with each other, so as to achieve power transmission between the power adapter and the device. Based on the embodiments of the present disclosure, a conventional power adapter and a new type of adapter can be used interchangeably, such that the demands of purchasing power adapters by customers can be reduced.

According to one embodiment of the present disclosure, a power delivery control module having a first interface, a second interface and a controller is disclosed. The first interface is configured to be coupled to a first external device. The second interface is configured to be coupled to a second external device. The second interface is a USB Type-C interface, and the first interface is not a USB interface. The controller is coupled to the first interface and the second interface. Wherein when the first interface is coupled to the first external device and the second interface is coupled to the second external device, the power delivery control module selectively delivers power from the first external device to the second external device or from the second external device to the first external device according to a power delivery specification.

According to one embodiment of the present disclosure, a power delivery control module having a first interface, a second interface and a controller is disclosed. The first interface is configured to be coupled to a first external device. The second interface is configured to be coupled to a second external device. The second interface is a USB Type-C interface, and the first interface is not a USB interface. The controller is coupled to the first interface and the second interface. Wherein when the first interface is coupled to the first external device and the second interface is coupled to the second external device, the power delivery control module delivers power from the first external device to the second external device according to a power delivery specification.

According to one embodiment of the present disclosure, a power delivery control module having a first interface, a second interface and a controller is disclosed. The first interface is configured to be coupled to a first external device. The second interface is configured to be coupled to a second external device. The second interface is a USB Type-C interface, and the first interface is not a USB interface. The controller is coupled to the first interface and the second interface. Wherein when the first interface is coupled to the first external device and the second interface is coupled to the second external device, the power delivery control module delivers power from the second external device to the first external device according to a power delivery specification.

Based on the above, the power delivery control module presented in the embodiments of the present disclosure can be respectively connected to a power adapter and a device incompatible with the power adapter through the first interface and the second interface. Moreover, by operations of a microprocessor, a voltage regulating circuit and a detection circuit, power transmission between different types of the power adapter and the device, can be achieved.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
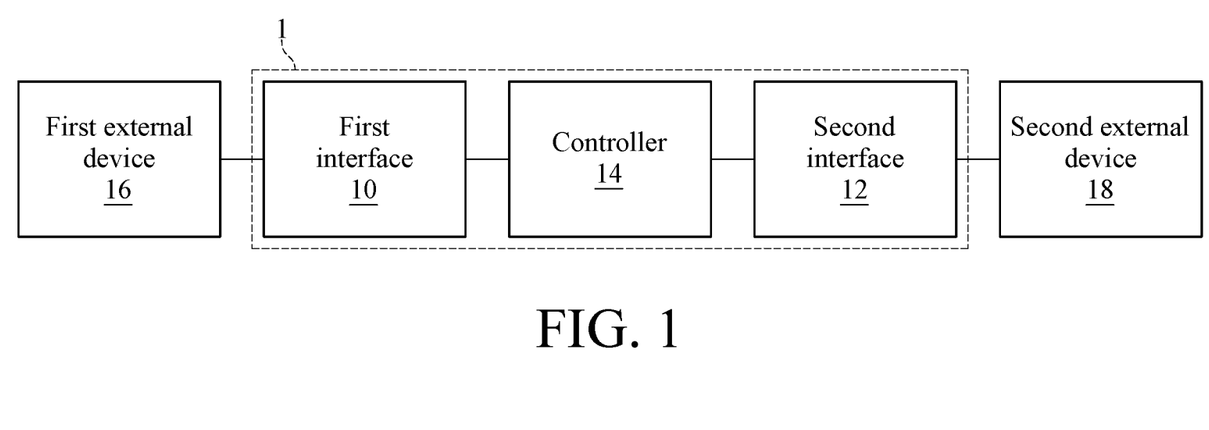
FIG. 1 is a block diagram of a power delivery control module according to one embodiment of the present disclosure.

Please refer to FIG. 1, which is a block diagram of a power delivery control module according to one embodiment of the present disclosure. As shown in FIG. 1, a power delivery control module 1 includes a first interface 10, a second interface 12 and a controller 14. The first interface 10 is configured to be coupled to a first external device 16. The second interface 12 is configured to be coupled to a second external device 18. In this embodiment, the second interface 12 is a USB-Type C interface, and the first interface 10 is not a USB interface. In practice, the first interface 10 could be an interface adapted to a conventional power adapter. The controller 14 is coupled to the first interface 10 and the second interface 12. When the first interface 10 is coupled to the first external device 16 and the second interface 12 is coupled to the second external device 18, the power delivery control module 1 selectively delivers a power from the first external device 16 to the second external device 18 or from the second external device 18 to the first external device 16. In practice, the direction of power delivery is determined by the controller 14 or the second external device 18. In one embodiment, the power delivery specification includes a delivery direction of the power between the first external device 16 and the second external device 18. The delivery direction of the power is determined depending on an input voltage of the power detected in the first interface 10 or the second interface 12. In an example, one of the first external device 16 and the second external device 18 is a power adapter and the other one of the first external device 16 and the second external device 18 is an electronic device. In a practical example, when the first external device 16 coupled to the first interface 10 is a power adapter and the second external device 18 coupled to the second interface 12 is an electronic device, the external power is supplied by the power adapter. The power would be delivered from the first external device 16 to the second external device 18. On the other hands, when the first external device 16 coupled to the first interface 10 is an electronic device and the second external device 18 coupled to the second interface 12 is a power adapter, the power would be delivered from the second external device 18 to the first external device 16.

In one embodiment, the power specification further includes a supply power supplied to the first external device 16 or the second external device 18, and the power delivery control module 1 performs a selection in a power supplying specification table via detecting the input voltage or an external selecting device, so as to determine the supply power. In one embodiment, the controller 14 implements a DC to DC conversion for the power and a power delivery between the first external device 16 and the second external device 18 implemented depending on the power delivery specification is a DC power delivery.

Figure 2:
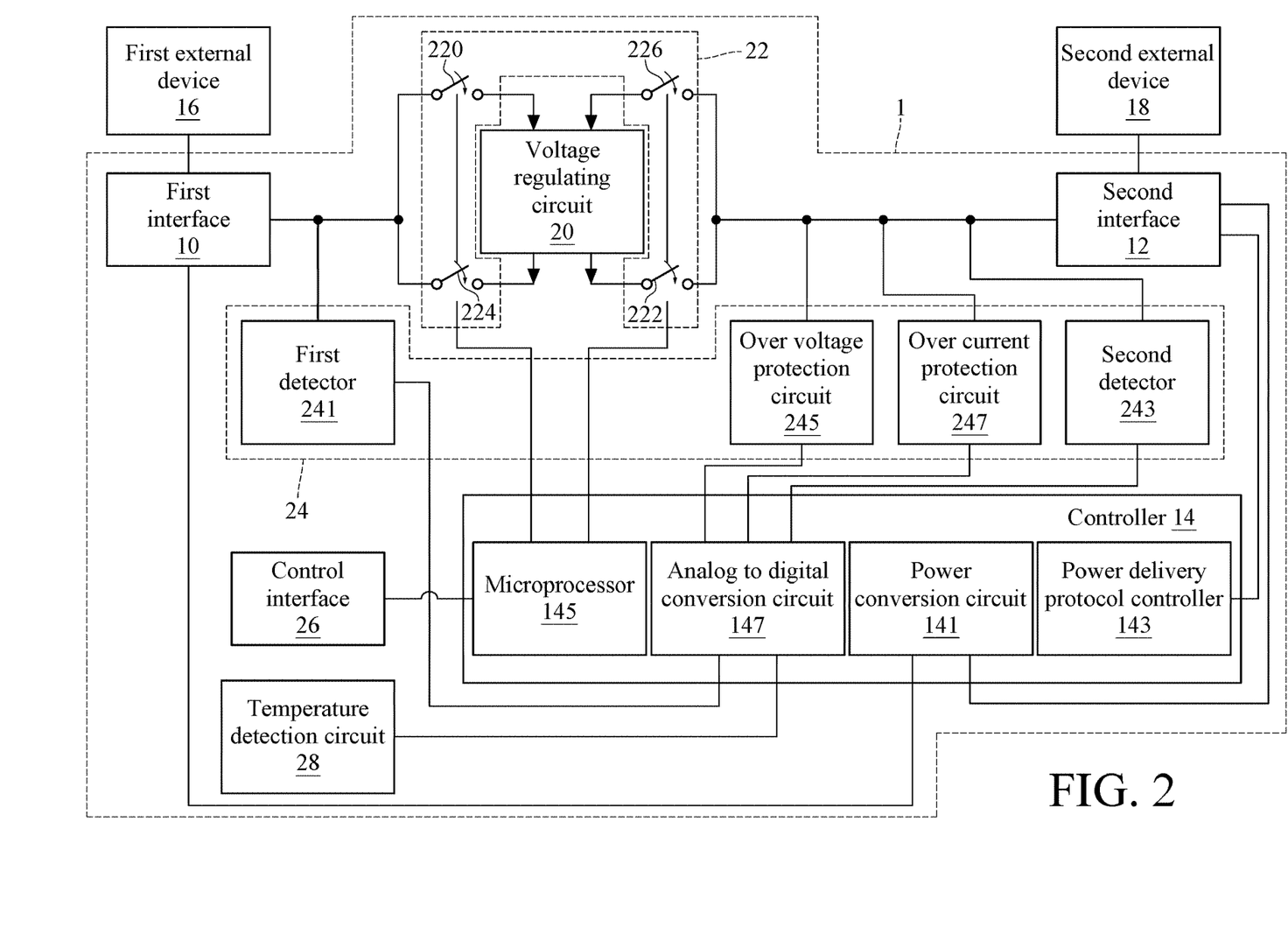
FIG. 2 is a detailed block diagram of the power delivery control module illustrated in FIG. 1.

Please refer to FIG. 2, which is a detailed block diagram of the power delivery control module illustrated in FIG. 1. As shown in FIG. 2, the controller 14 includes a power conversion circuit 141, a power delivery protocol controller 143 and a microprocessor 145. The power conversion circuit 141 is configured to implement a voltage conversion to convert the power for supplying converted power to the controller 14. More specifically, the power conversion circuit 141 is capable of converting the voltage of the power to a voltage suitable for the controller 14. The power delivery protocol controller 143 is coupled to the second interface 12 and configured to obtain the power delivery specification via the second interface 12. The microprocessor 145 is coupled to the power delivery protocol controller 143. The microprocessor 145 regulates the input voltage of the power according to the power delivery specification. In one embodiment, as shown in FIG. 2, the power delivery control module 1 further includes a voltage regulating circuit 20 coupled to the first interface 10, the second interface 12 and the controller 14. The microprocessor 145 controls the voltage regulating circuit 20 to regulate the input voltage according to the power delivery specification. Specifically, the voltage regulating circuit 20 is configured to regulate the voltage amount of the input voltage. In one embodiment, as shown in FIG. 2, the power delivery control module 1 further includes a switch circuit 22 controlled by the microprocessor 145, and the switch circuit 22 is configured to selectively control the power to be delivered from the first external device 16 to the second external device 18 or from the second external device 18 to the first external device 16. In other words, the switch circuit 22 is configured to control the power to be delivered from the first interface 10 to the second interface 12 or from the second interface 12 to the first interface 10 as the switch circuit 22 is turned on. The microprocessor 145 is configured to detect the direction of the power in the whole system. When the power comes from the first interface 10, the microprocessor 145 controls the switch circuit 22 to deliver the power outputted from the voltage regulating circuit 20 to the second interface 12. When the power comes from the second interface 12, the microprocessor 145 controls the switch circuit 22 to deliver the power outputted from the voltage regulating circuit 20 to the first interface 10.

More specifically, the switch circuit 22 includes a first switch module and a second switch module. The first switch module has a first switch 220 and a second switch 222. The second switch module has a third switch 224 and a fourth switch 226. The first switch module is configured to be turned on as the power comes from the first interface 10, so that the power is delivered from the first interface 10 to the second interface 12. The second switch module is configured to be turned on as the power comes from the second interface 12, so that the power is delivered from the second interface 12 to the first interface 10. Specifically, when the microprocessor 145 determines that the power comes from the first interface 10, the first switch 220 and the second switch 222 of the first switch module both are turned on while the third switch 224 and the fourth switch 226 of the second switch module both are not turned on. In this condition, the power is delivered from the first interface 10 to the second interface 12. On the other hand, when the microprocessor 145 determines that the power comes from the second interface 12, the first switch 220 and the second switch 222 of the first switch module both are not turned on while the third switch 224 and the fourth switch 226 of the second switch module are both turned. In this condition, the power is delivered from the second interface 12 to the first interface 10.

In a practical example, the first interface 10 acquires a power from an external power source via a conventional power adapter (e.g. the first external device 16), and the second interface 12 is coupled to an external device (e.g. second external device 18) having a function of USB Type-C. The microprocessor 145 determines that the power comes from the first interface 10 and controls the switch circuit 22 to turn on both of the first switch 220 and the second switch 222, so that the power is delivered to the second external device 18. In another example, the power delivery control module 1 further includes a control interface 26 (external selecting device) electrically connected to the microprocessor 145. The control interface 26 is configured to send out a reminder as the power comes from the second interface 12. A user uses the control interface 26 to send a control command to the microprocessor 145 according to the reminder. The microprocessor 145 controls the voltage regulating circuit 20 to regulate the voltage of the power according to the control command.

For example, an assumption is made that the first interface 10 is coupled to an external device (e.g. the first external device 16) adapted to a conventional power adapter, and the second interface 12 acquires a power from an external power source via a USB Type-C power adapter (e.g. the second external device 18). In this condition, the microprocessor 34 determines that the power comes from the second interface 12 and controls the switch circuit 22 to turn on the third switch 224 and the fourth switch 226. In this example, the control interface 26 sends out a reminder, such as a blinking light of an LED, to inform the user to select a voltage suitable for the external device on the control interface 26. In one embodiment, the power delivery control module 1 further includes a detection circuit 24 coupled to the first interface 10, the second interface 12 and the controller 14. The detection circuit 24 is configured to detect if the input voltage of the power is received by the first interface 10 or by the second interface 12. In one embodiment, as shown in FIG. 2, the detection circuit 24 includes a first detector 241 and a second detector 243. The first detector 241 is coupled to the first interface 10 and the controller 14 and configured to detect voltage information and current information of the first interface 10. The second detector 243 is coupled to the second interface 12 and the controller 14. The second detector 243 is configured to detect voltage information and current information of the second interface 12. The input voltage received by the first interface 10 is related to the voltage information and the current information detected in the first interface 10, and the input voltage received by the second interface 12 is related to the voltage information and the current information detected in the second interface 12. In one example, both of the first detector 241 and the second detector 243 may include a circuit having resistor(s) and operational amplifier(s). In another example, both of the first detector 241 and the second detector 243 may include a circuit having switch capacitor(s) and operational amplifier(s). The operational amplifier(s) could be inverting operational amplifier(s) or non-inverting operational amplifier(s). The types of the operational amplifier(s) could be current amplifier(s), voltage amplifier(s), trans-impedance amplifier(s) or trans-conductance amplifier(s). In further another example, both of the first detector 241 and the second detector 243 may further have a level shift circuit used for converting the voltage which is detected, so that the controller 14 is capable of implementing comparisons and determinations for backend circuits using the converted voltage. Person having ordinary skills in the art is able to design the first detector and the second detector as described above according to actual demands, and the present disclosure is not limited to the above examples given.

In one embodiment, the detection circuit 24 further includes an over voltage protection circuit 245 and an over current protection circuit 247. The over voltage protection circuit 245 is coupled to the second interface 12 and the controller 14 and configured to detect the voltage passing through the second interface 12. The over current protection circuit 247 is coupled to the second interface 12 and the controller 14 and configured to detect the current passing through the second interface 12. The controller 14 selectively controls the power to be delivered between the first external device 16 and the second external device 18 according to the voltage or the current in the second interface 12. Specifically, when the voltage value of the voltage detected by the over voltage protection circuit 245, or the current value of the current detected by the over current protection circuit 247 is more than a predetermined value, the controller 14 would shut down the power delivery in the whole circuit in case the whole circuit is broken because of an abnormal voltage value or an abnormal current value, so that the whole circuit is protected. In one example, as shown in FIG. 2, the controller 14 may further include an analog to digital conversion circuit 147 which may be implemented by a digital to analog converter (DAC) and a comparator, for comparing the voltage detected by the first detector 241 and the second detector 243 to a voltage of the analog to digital conversion circuit. The microprocessor 145 controls the switch circuit 22 according to the comparison result for determining whether to deliver the power to the first external device 16, or whether to deliver the power to the second external device 18. In practice, in FIG. 2, the power conversion circuit 141, the power delivery protocol controller 143, the microprocessor 145 and the analog to digital conversion circuit 147 of the controller 14 have electrical connections with each other.

In one embodiment, the power delivery control module 1 may further include a temperature detection circuit 28 coupled to the controller 14. The temperature detection circuit 28 is adjacent to the voltage regulating circuit 20 and configured to detect temperature information of the voltage regulating circuit 20. The microprocessor 145 determines whether to deliver the power between the first external device 16 and the second external device 18 according to a predetermined value and the temperature information. Specifically, when a temperature value indicated by the temperature information is more than the predetermined value, it means that the operating temperature of the voltage regulating circuit 20 is excessively high. In this condition, the microprocessor 145 would shut down the power delivery between the first external device and the second external device, for achieving the purpose of protecting the power delivery control module 1.

Figure 3:
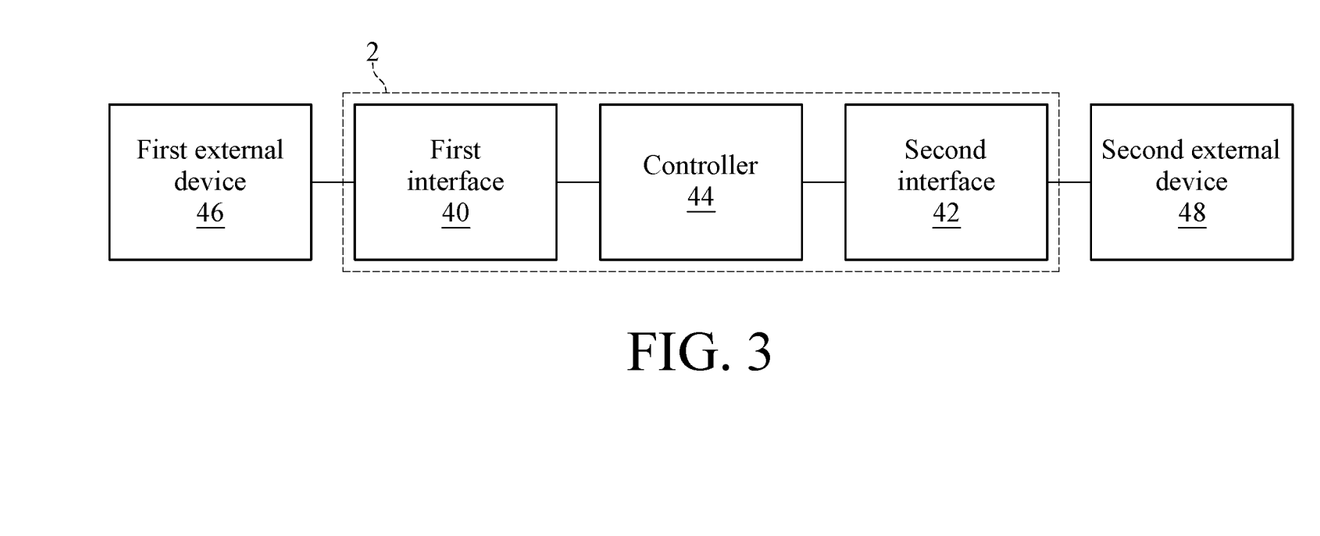
FIG. 3 is a block diagram of a power delivery control module according to another embodiment of the present disclosure.

Please refer to FIG. 3, which is a block diagram of a power delivery control module according to another embodiment of the present disclosure. As shown in FIG. 3, a power delivery control module 2 includes a first interface 40, a second interface 42 and a controller 44. The first interface 40 is configured to be coupled to a first external device 46. The second interface 42 is configured to be coupled to a second external device 48. The second interface 42 is a USB Type-C interface, and the first interface 40 is not a USB interface. The controller 44 is coupled to the first interface 40 and the second interface 42. When the first interface 40 is coupled to the first external device 46 and the second interface 42 is coupled to the second external device 48, the power delivery control module 2 delivers the power from the first external device 46 to the second external device 48 according to a power delivery specification.

Figure 4:
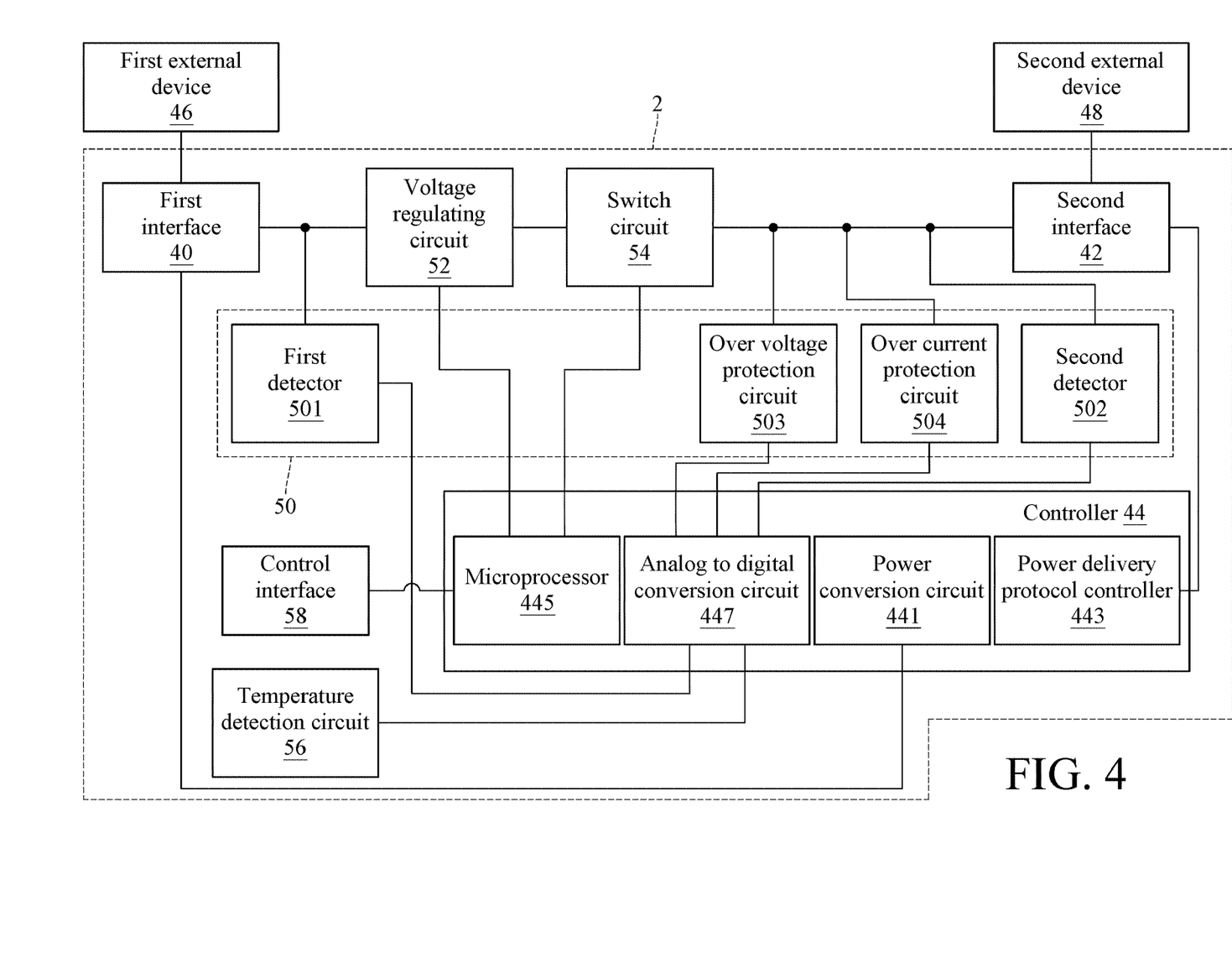
FIG. 4 is a detailed block diagram of the power delivery control module illustrated in FIG. 3.

Please refer to FIG. 4, which is a detailed block diagram of the power delivery control module illustrated in FIG. 3. As shown in FIG. 4, the controller 44 includes a power conversion circuit 441, a power delivery protocol controller 443 and a microprocessor 445. The power conversion circuit 441 is configured to implement a voltage conversion to convert the power in order to supply converted power to the controller 44. More specifically, the power conversion circuit 441 is capable of converting the voltage of the power to be a voltage suitable for the controller 44. The power delivery protocol controller 443 is coupled to the second interface 42 and configured to obtain a power delivery specification via the second interface 42. The microprocessor 445 is coupled to the power delivery protocol controller 443. The microprocessor 445 regulates the input voltage of the power according to the power delivery specification. In one embodiment, the power delivery control module 2 further includes a detection circuit 50 coupled to the first interface 40, the second interface 42 and the controller 44 and configured to detect if the input voltage is received by the first interface 40 or by the second interface 42. In one embodiment, as shown in FIG. 4, the detection circuit 50 includes a first detector 501 and a second detector 502. The first detector 501 is coupled between the first interface 40 and the controller 44. The first detector 501 is configured to detect voltage information and current information of the first interface 40. The second detector 502 is coupled between the second interface 42 and the controller 44. The second detector 502 is configured to detect voltage information and current information of the second interface 42. The input voltage received by the first interface 40 is related to the voltage information and the current information of the first interface 40, and the input voltage received by the second interface 42 is related to the voltage information and the current information of the second interface 42. In one example, both of the first detector 501 and the second detector 502 may include a circuit having resistor(s) and operational amplifier(s). In another example, both of the first detector 501 and the second detector 502 may include a circuit having switch capacitor(s) and operational amplifier(s). The operational amplifier(s) could be inverting operational amplifier(s) or non-inverting operational amplifier(s). The types of the operational amplifier(s) could be current amplifier(s), voltage amplifier(s), trans-impedance amplifier(s) or trans-conductance amplifier(s). In a further another example, the first detector 501 and the second detector 502 may further include a level shift circuit used for converting the voltage which is detected, so that the controller 44 is capable of implementing comparisons and determinations for backend circuits using the converted voltage. Person having ordinary skills in the art is able to design the first detector and the second detector as described above according to actual demands, and the present disclosure is not limited to the above examples given.

In one embodiment, the power delivery control module 2 may further include a voltage regulating circuit 52 coupled to the first interface 40, the second interface 42 and the controller 44. The microprocessor 445 controls the voltage regulating circuit 52 to regulate the input voltage according to the power delivery specification. Specifically, the detection circuit 50 could be used for detecting the voltage value and the current value of the power, and the voltage regulating circuit 52 is used for regulate the voltage of the power for outputting a proper voltage. In one example, the voltage regulating circuit 52 is a voltage regulator for increasing or decreasing a voltage. In one embodiment, the power delivery control module 2 further includes a switch circuit 54 controlled by the microprocessor 445. The switch circuit 54 is configured to control the power to be delivered from the first external device 46 to the second external device 48. More specifically, the switch circuit 54 is configured to deliver the power to the second interface 42 when being turned on. The microprocessor 445 may obtain a voltage request from the second external device 48 via the second interface 42. In this embodiment, the second interface 42 is a USB Type-C interface. In an example, the second interface 42 may exchange power information of a supply terminal and a receiving terminal in several ways. The second external device 48 is a portable device having a function of USB Type-C. The microprocessor 445 is capable of obtaining the voltage (voltage request) required by the second external device 48 via the second interface 42. The microprocessor 445 further controls the voltage regulating circuit 52 to regulate the voltage of the power according the voltage request. More specifically, the voltage request indicates the voltage consumed by the second external device 13 for operations. The microprocessor 445 controls the voltage regulating circuit 52 to regulating the voltage outputted depending on the voltage consumed by the second external device 13 for operations. When the microprocessor 445 determines the voltage outputted does not satisfy the voltage request, the microprocessor 445 turns off the switch circuit 54.

In one embodiment, as shown in FIG. 4, the second detector 502 is configured to detect the current flowing through the second interface 42 and the output of the voltage regulating circuit 52. In one embodiment, the switch circuit 54 is a power MOSFET or other equivalent electronic component, but the present disclosure is not limited to the embodiments. When the voltage detected by the second detector 502 satisfies the voltage request, the microprocessor 445 turns on the switch circuit 54 so that the power could be delivered to the second external device 48. On the other hands, when the voltage detected by the second detector 502 does not satisfy the voltage request, the microprocessor 445 turns of the switch circuit 54 so that the power would not be delivered to the second external device 48. In a specific example, if the voltage of the power is 12 volts and the voltage request is 20 volts, the microprocessor 445 accordingly increases the voltage of the power from 12 volts to 20 volts by controlling the voltage regulating circuit 52. In this condition, the voltage satisfies the voltage request of the second external device 48, the microprocessor 445 turns on the switch circuit 54 so that the power is delivered to the second external device 48. In another example, because the voltage regulating circuit 52 is damaged or in abnormal operations, the voltage of the power outputted is less than or higher than the voltage request which is 20 volts. In this condition, the microprocessor 445 turns off the switch circuit 54 to prevent the second external device 48 from being in abnormal operations or damaged because of not receiving a voltage satisfying the voltage request.

In one embodiment, the microprocessor 445 provides a specification of power supply depending on the voltage regulating circuit 52. The specification of power supply indicates regulated voltage(s) which could be outputted via voltage regulation of the voltage regulating circuit 52 as a voltage received by the voltage regulating circuit 52. Specifically, when a voltage is inputted to the voltage regulating circuit 52, the voltage regulating circuit 52 is capable of outputting a voltage different from the voltage inputted by regulating the voltage inputted according to its own characteristics of voltage conversion. In an example, please refer to Table 1, which is a specification of power supply according one embodiment of the present disclosure. As shown in Table 1, it is assumed that the voltage of the power is 5 volts originally, and the voltage which could be outputted by the voltage regulating circuit 52 is 5 volts, 12 volts, 15 volts and 20 volts, respectively corresponding to current of 3 amps, 3 amps, 2.5 amps and 2 amps. If the second external device 48 requires the voltage of 20 volts and the current of 2 amps, then the microprocessor 445 selects a specification of power supply D from the Table 1, which is the voltage of 20 volts and its corresponding current of 2 amps. In this condition, the voltage regulating circuit 52 outputs the voltage of 20 volts by performing a voltage regulation, so that the voltage request of the second external device 48 is satisfied. In the foregoing embodiment, the voltage regulating circuit 52 is implemented as a buck regulator. However, in another example, the voltage regulating circuit 52 is implemented as a boost regulator or a buck-boost regulator. The voltage values and current values as described in the foregoing embodiment are generally adapted to electronic devices and are for illustrations only. The present disclosure is not limited to those voltage values and current values in the foregoing embodiment.

TABLE 1

|  | Voltage (volt) | Current (amp) |
| --- | --- | --- |
| specification of power supply A | 5 | 3 |
| specification of power supply B | 12 | 3 |
| specification of power supply C | 15 | 2.5 |
| specification of power supply D | 20 | 2 |

In the foregoing embodiment, the microprocessor 445 selects a proper voltage from the table of power supply (Table 1) according to a voltage request. However, in another embodiment, the microprocessor 445 increases the voltage outputted according to the voltage request of the second external device 48 for outputting a voltage satisfying the voltage request. For example, on an assumption, the voltage which could be outputted by the voltage regulating circuit 52 is 5 volts, 12 volts, 19 volts and 24 volts, and the voltage request of the second external device 48 is 19 volts. In this condition, the microprocessor 445 controls the voltage regulating circuit 52 to gradually increase the outputted voltage from 5 volts to 19 volts. Accordingly, the power having 19 volts is delivered to the second external device 48.

In one embodiment, as shown in FIG. 4, the controller 44 includes an analog to digital conversion circuit 447, implemented by a digital to analog converter (DAC) and a comparator, is used for comparing the voltage detected by the first detector 501 and the second detector 502 to a predetermined voltage of an analog to digital converter (ADC). The microprocessor 445 controls the switch circuit 54 to determine whether to deliver the power to the second external device 48 according to the comparison result.

In one embodiment, as shown in FIG. 4, the power delivery control module 1 further includes a temperature detection circuit 56 coupled to the controller 44. The temperature detection circuit 56 is adjacent to the voltage regulating circuit 52 and configured to detect temperature information of the voltage regulating circuit 52. The microprocessor 445 determines whether to allow the power to be delivered from the first external device 46 to the second external device 48 according to a predetermined value and the temperature information. In an example, the temperature detection circuit 56 is implemented using thermistor(s) or I2C temperature sensor(s). The temperature of the voltage regulating circuit 52 may increase during operations, and it is indicated that the temperature of the voltage regulating circuit 52 is excessively high when the value of the temperature is more than a predetermined value. In this condition, the temperature detection circuit 56 notifies the microprocessor 445 to turns off the switch circuit 54. Accordingly, the power would not be delivered to the second external device 48 for preventing the second external device 48 from being damaged as the second external device 48 receives an abnormal power, and also the power delivery control module 2 is protected. As shown in FIG. 4, the power delivery control module 2 further has a control interface 58 including one or more buttons and indicator lights. The one or more buttons are provided for a user to switch modes and the one or more indicator lights are provided to indicate the current operation state of the device. In one embodiment, as shown in FIG. 4, the detection circuit 50 further includes an over voltage protection circuit 503 and an over current protection circuit 504. The voltage protection circuit 503 is coupled between the second interface 42 and the controller 44 and configured to detect a voltage across the second interface 42. The over current protection circuit 504 is coupled between the second interface 42 and the controller 44 and configured to detect a current flowing through the second interface 42. In practice, in FIG. 4, the power conversion circuit 441, the power delivery protocol controller 443, the microprocessor 445 and the analog to digital conversion circuit 447 of the controller 44 have electrical connections with each other.

Figure 5:
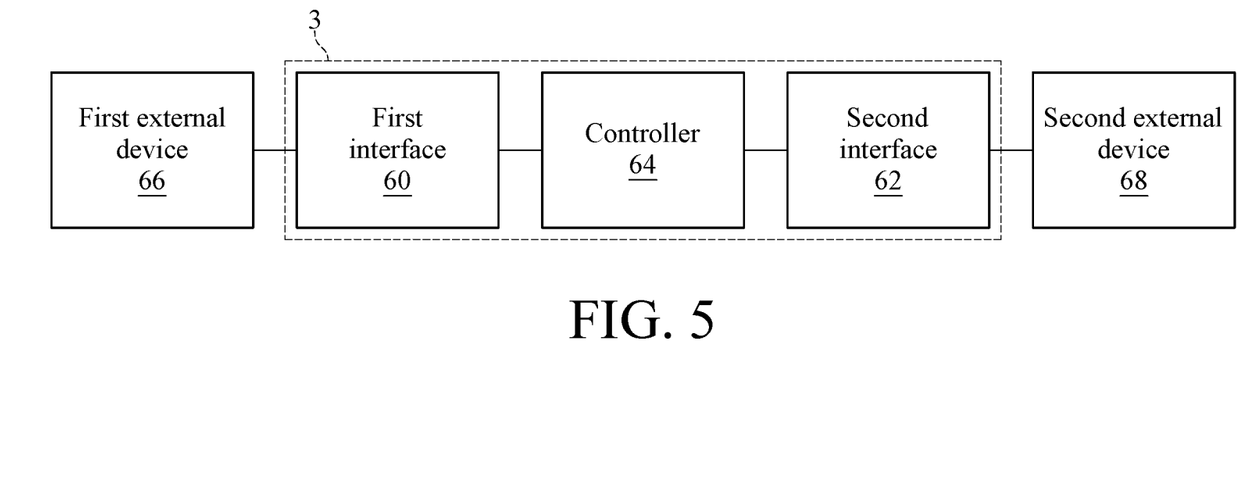
FIG. 5 is a block diagram of a power delivery control module according to another embodiment of the present disclosure.

Please refer to FIG. 5, which is a block diagram of a power delivery control module according to another embodiment of the present disclosure. Similar to the embodiment of FIG. 3, the power delivery control module 3 of FIG. 5 includes a first interface 60, a second interface 62 and a controller 64. The first interface 60 is configured to be coupled to a first external device 66. The second interface 62 is configured to be coupled to a second external device 68. The second interface 62 is a USB Type-C interface, and the first interface 60 is not a USB interface. The controller 64 is coupled to the first interface 60 and the second interface 62. Different from FIG. 3, in FIG. 5, when the first interface 60 is coupled to the first external device 66 and the second interface 62 is coupled to the second external device 68, the power delivery control module 3 delivers power from the second external device 68 to the first external device 66 according to a power delivery specification.

Figure 6:
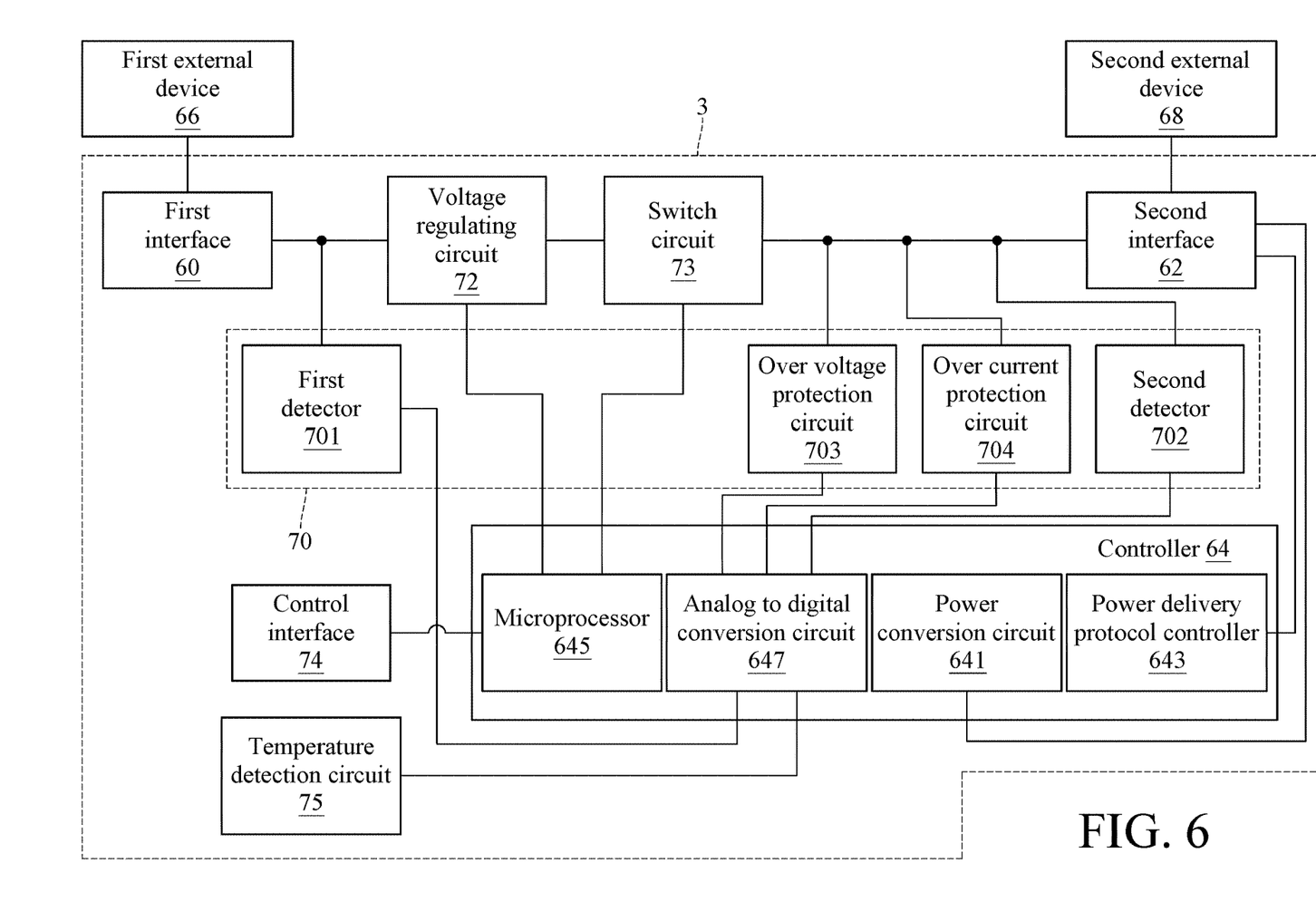
FIG. 6 is a detailed block diagram of the power delivery control module illustrated in FIG. 5.

Please refer to FIG. 6, which is a detailed block diagram of the power delivery control module illustrated in FIG. 5. As shown in FIG. 6, the controller 64 includes a power conversion circuit 641, a power delivery protocol controller 643 and a microprocessor 645. The power conversion circuit 641 is configured to implement a voltage conversion to convert the power in order to supply converted power to the controller 64. More specifically, the power conversion circuit 641 is capable of converting the voltage of the power to be a voltage suitable for the controller 64. The power delivery protocol controller 643 is coupled to the second interface 62 and configured to obtain the power delivery specification via the second interface 62. The microprocessor 645 is coupled to the power delivery protocol controller 643. The microprocessor 645 regulates the input voltage of the power according to the power delivery specification. In one embodiment, the power delivery control module 3 further includes a detection circuit 70 coupled to the first interface 60, the second interface 62 and the controller 64 and configured to detect if the input voltage is received by the first interface 60 or by the second interface 62. In one embodiment, as shown in FIG. 6, the detection circuit 70 includes a first detector 701 and a second detector 702. The first detector 701 is coupled to the first interface 60 and the controller 64 and configured to detect voltage information and current information of the first interface 60. The second detector 702 is coupled to the second interface 62 and the controller 64 and configured to detect voltage information and current information of the second interface 62. The input voltage received by the first interface 60 is related to the voltage information and the current information of the first interface 60. The input voltage received by the second interface 62 is related to the voltage information and the current information of the second interface 62. In one example, both of the first detector 701 and the second detector 702 may include a circuit having resistor(s) and operational amplifier(s). In another example, both of the first detector 701 and the second detector 702 may include a circuit having switch capacitor(s) and operational amplifier(s). The operational amplifier(s) could be inverting operational amplifier(s) or non-inverting operational amplifier(s). The types of the operational amplifier(s) could be current amplifier(s), voltage amplifier(s), trans-impedance amplifier(s) or trans-conductance amplifier(s). In further another example, both of the first detector 701 and the second detector 702 may further have a level shift circuit used for converting the voltage which is detected, so that the controller 64 is capable of implementing comparisons and determinations for backend circuits using the converted voltage. Person having ordinary skills in the art is able to design the first detector and the second detector as described above according to actual demands, and the present disclosure is not limited to the above examples given. In one embodiment, the power delivery control module 3 further includes a voltage regulating circuit 72 coupled to the first interface 60, the second interface 62 and the controller 64. The microprocessor 645 controls the voltage regulating circuit 72 to regulate the input voltage according to the power delivery specification.

Specifically, the first detector 701 is configured to detect voltage across and current flowing through the first interface 60. The voltage regulating circuit 72 is configured to regulate the power to output a power having a proper voltage. In one embodiment, the power delivery control module 3 may further include a switch circuit 73 controlled by the microprocessor 645. The switch circuit 73 is configured to control the power to be delivered from the second external device 68 to the first external device 66. More specifically, the switch circuit 73 controls the power to be delivered to the first interface 60 as being turned on. The microprocessor 645 controls the voltage regulating circuit 72 to regulate the voltage of the power according to operation commands. Specifically, the voltage regulating circuit 72 is capable of outputting a power having a proper voltage according to its own characteristics of voltage conversion when receiving the power having a voltage. Herein, the proper voltage may be 5 volts, 10 volts, 12 volts, 20 volts, 24 volts and etc. The microprocessor 645 selects a proper voltage for first external device 66 among a plurality of voltages according to the operation command of a user. When the microprocessor 645 determines that the plurality of voltages that the voltage regulating circuit 72 is able to provide may not satisfy the operation command of the user, the microprocessor 645 turns the switch circuit 73 off.

In one embodiment, the power delivery control module 3 further includes a control interface 74 electrically connected to the microprocessor 645. The control interface 74 is controlled by a user to output one or more operation commands. Specifically, the control interface 74 is a user interface of the power delivery control module 3, having a plurality of buttons. Each of the buttons corresponds to a single voltage which the voltage regulating circuit 72 is able to output. In the foregoing embodiment, the control interface 74 may have five buttons, corresponding to voltages of 5 volts, 12 volts, 19 volts, 20 volts and 24 volts respectively. The user is allowed to correspondingly press one of those buttons to output the operation command according to the voltage required by the first external device 66. For example, the user may know the voltage required by the first external device 66 is 24 volts via information of the first external device 66 (e.g. a table of device specification attached on the first external device 66). Accordingly, the user presses the button corresponding to the voltage of 24 volts to output the operation command indicating that the voltage of 24 is required. Then the microprocessor 645 controls the voltage regulating circuit 72 to output a power having a voltage of 24 volts according to the operation command and further supplies the power having a voltage of 24 volts to the first external device 66 for operating.

Similar to the embodiment of FIG. 4, the power delivery control module 3 of FIG. 6 includes a second detector 702 electrically connected to the switch circuit 73. The second detector 702 is configured to detect the voltage outputted by the voltage regulating circuit 72. When the voltage detected by the second detector 702 satisfies the operation command of the user, the microprocessor 645 turns on the switch circuit 73 so that the power could be delivered to the first external device 66. On the other hand, when the voltage detected by the second detector 702 does not satisfy the operation command of the user, the microprocessor 645 turns off the switch circuit 73 so that the power would not be delivered to the first external device 66. More specifically, in the process of power delivery, the microprocessor 645 ensures the voltage and the current is in normal operation state using the first detector 701 and the second detector 702. Once an abnormal event happens, the switch circuit 73 is forced to be turned off to ensure the safety of electricity. As shown in FIG. 2, the power delivery control module 3 further includes a temperature detection circuit 75 electrically connected to the microprocessor 645. Similar to the embodiment of FIG. 2, the temperature detection circuit 75 of FIG. 6 is adjacent to the voltage regulating circuit 72 and configured to detect the temperature of the voltage regulating circuit 72. When the value of the temperature of the voltage regulating circuit 72 is more than a predetermined value, the microprocessor 645 turns off the switch circuit 73 so that the power would not be delivered to the first external device 66. In one embodiment, as shown in FIG. 6, the detection circuit 70 further includes an over voltage protection circuit 703 and an over current protection circuit 704. The over voltage protection circuit 703 is coupled to the second interface 62 and the controller 64 and configured to detect the voltage across the second interface 12. The over current protection circuit 704 is coupled to the second interface 62 and the controller 64 and configured to detect the current flowing through the second interface 62. In one example, as shown in FIG. 6, the controller 64 includes an analog to digital conversion circuit 647, and its operation is similar to the operations of the analog to digital conversion circuits illustrated in the foregoing embodiments, so no more repeated here. In practice, in FIG. 6, the power conversion circuit 641, the power delivery protocol controller 643, the microprocessor 645 and the analog to digital conversion circuit 647 of the controller 64 have electrical connections with each other.

Based on the above descriptions, in operations of the power delivery control module of the present disclosure, the power delivery control module is respectively connected to a power adapter and a device incompatible with the power adapter through the first interface and the second interface. Moreover, by operations of a microprocessor, a voltage regulating circuit and a detection circuit, the power supplied by the power adapter is output to the device, so that the transmission of power between the power adapter and the device, which type is different from the type of the power adapter, could be achieved.

What is claimed is:

1. A power delivery control module, comprising:
   a first interface configured to be coupled to a first external device;
   a second interface configured to be coupled to a second external device, wherein the second interface is a USB type-C interface and the first interface is not a USB interface; and
   a controller coupled to the first interface and the second interface;
   a voltage regulating circuit coupled to the first interface, the second interface and the controller;
   a switch circuit coupled to the controller and controlling a power to be delivered from the first interface to the second interface or from the second interface to the first interface selectively according to a comparison result;
   wherein when the first interface is coupled to the first external device and the second interface is coupled to the second external device, the power is selectively delivered from the first external device to the second external device, or from the second external device to the first external device according to a power delivery specification;
   wherein the power delivery specification comprises a supply power supplied to the first external device or the second external device, and the supply power is selected from a plurality of power supplying specifications in a power supplying specification table by detecting an input voltage in the first interface or the second interface or by detecting an external selecting device,
   wherein the voltage regulating circuit is controlled by the controller and capable to regulate the input voltage to any of the plurality of power supplying specifications.

2. The power delivery control module according to claim 1, wherein the power delivery specification comprises a delivery direction of the power between the first external device and the second external device, and the delivery direction is determined depending on the input voltage detected in the first interface or the second interface.

3. The power delivery control module according to claim 2, wherein the controller comprises:
   a power conversion circuit configured to implement a voltage conversion to convert the power for supplying converted power to the controller;
   an analog to digital conversion circuit configured to compare the input voltage to a predetermined voltage for generating the comparison result;
   a power delivery protocol controller coupled to the second interface; and
   a microprocessor coupled to the power delivery protocol controller, wherein the microprocessor regulates the input voltage according to the power delivery specification obtained from the power delivery protocol controller and controls the power to be selectively delivered to the first interface or the second interface according to the comparison result by controlling the switch circuit.

4. The power delivery control module according to claim 3, further comprising:
   a temperature detection circuit coupled to the controller, wherein the temperature detection circuit is adjacent to the voltage regulating circuit and is configured to detect temperature information of the voltage regulating circuit, and the microprocessor determines whether to control the power to be delivered between the first external device and the second external device according to a predetermined value and the temperature information.

5. The power delivery control module according to claim 2, further comprising:
   a detection circuit coupled to the first interface, the second interface and the controller and configured to detect if the input voltage is received by the first interface or by the second interface.

6. The power delivery control module according to claim 5, wherein the detection circuit comprises:
   a first detector coupled between the first interface and the controller and configured to detect voltage information and current information of the first interface; and
   a second detector coupled between the second interface and the controller and configured to detect voltage information and current information of the second interface;
   wherein the input voltage received by the first interface is related to the voltage information and the current information of the first interface, and the input voltage received by the second interface is related to the voltage information and the current information of the second interface.

7. The power delivery control module according to claim 6, wherein the detection circuit further comprises:
   an over voltage protection circuit coupled between the second interface and the controller and configured to detect a voltage across the second interface; and
   an over current protection circuit coupled between the second interface and the controller and configured to detect a current flowing through the second interface;
   wherein the controller selectively controls the power to be delivered between the first external device and the second external device according to the voltage across the second interface or the current flowing through the second interface.

8. The power delivery control module according to claim 1, wherein one of the first external device and the second external device is a power adapter and the other one of the first external device and the second external device is an electronic device.

9. The power delivery control module according to claim 1, wherein the controller implements a DC to DC conversion for the power and a power delivery between the first external device and the second external device implemented depending on the power delivery specification is a DC power delivery.

10. A power delivery control module, comprising:
   a first interface configured to be coupled to a first external device;
   a second interface configured to be coupled to a second external device, wherein the second interface is a USB type-C interface and the first interface is not a USB interface; and
   a controller coupled to the first interface and the second interface;
   a voltage regulating circuit coupled to the first interface, the second interface and the controller;
   a switch circuit coupled to the controller and controlling a power to be delivered from the first interface to the second interface according to a comparison result;
   wherein when the first interface is coupled to the first external device and the second interface is coupled to the second external device, the power is delivered from the first external device to the second external device according to a power delivery specification;

wherein the power delivery specification comprises a supply power supplied to the first external device or the second external device, and the supply power is selected from a plurality of power supplying specifications in a power supplying specification table by detecting an input voltage in the first interface or by detecting an external selecting device, wherein the voltage regulating circuit is controlled by the controller and capable to regulate the input voltage to any of the plurality of power supplying specifications.

11. The power delivery control module according to claim 10, wherein the controller comprises:

a power conversion circuit configured to implement a voltage conversion to convert the power received by the first interface for supplying converted power to the controller;

an analog to digital conversion circuit configured to compare an input voltage of the power to a predetermined voltage for generating a comparison result;

a power delivery protocol controller coupled to the second interface; and a microprocessor coupled to the power delivery protocol controller, wherein the microprocessor regulates the input voltage according to the power delivery specification obtained from the power delivery protocol controller and selectively controls the power to be delivered from the first interface to the second interface according to the comparison result by controlling the switch circuit.

12. A power delivery control module, comprising:

a first interface configured to be coupled to a first external device;

a second interface configured to be coupled to a second external device, wherein the second interface is a USB type-C interface and the first interface is not a USB interface; and a controller coupled to the first interface and the second interface;

a voltage regulating circuit coupled to the first interface, the second interface and the controller;

a switch circuit coupled to the controller and controlling a power to be delivered from the second interface to the first interface according to a comparison result;

wherein when the first interface is coupled to the first external device and the second interface is coupled to the second external device, the power is delivered from the second external device to the first external device according to a power delivery specification;

wherein the power delivery specification comprises a supply power supplied to the first external device or the second external device, and the supplying power is selected from a plurality of power supplying specifications in a power supplying specification table by detecting an input voltage in the second interface or by detecting an external selecting device, wherein the voltage regulating circuit is controlled by the controller and capable to regulate the input voltage to any of the plurality of power supplying specifications.

13. The power delivery control module according to claim 12, wherein the controller comprises:

a power conversion circuit configured to implement a voltage conversion to convert the power received by the second interface for supplying converted power the controller;

an analog to digital conversion circuit configured to compare an input voltage of the power to a predetermined voltage for generating a comparison result;

a power delivery protocol controller coupled to the second interface; and a microprocessor coupled to the power delivery protocol controller, wherein the microprocessor regulates the input voltage according to the power delivery specification obtained from the power delivery protocol controller and selectively controls the power to be delivered from the second interface to the first interface according to the comparison result by controlling the switch circuit.

* * * * *